United States Patent
Li et al.

(10) Patent No.: US 11,881,823 B2
(45) Date of Patent: Jan. 23, 2024

(54) POWER AMPLIFIER CIRCUIT

(71) Applicant: SMARTER MICROELECTRONICS (GUANG ZHOU) CO., LTD., Guangzhou (CN)

(72) Inventors: Yongle Li, Guangzhou (CN); Limin Yu, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 420 days.

(21) Appl. No.: 17/134,408

(22) Filed: Dec. 27, 2020

(65) Prior Publication Data
US 2021/0320632 A1    Oct. 14, 2021

Related U.S. Application Data

(63) Continuation of application No. PCT/CN2020/122215, filed on Oct. 20, 2020.

(30) Foreign Application Priority Data

Apr. 13, 2020 (CN) .......................... 202010287500.3

(51) Int. Cl.
H03F 1/22 (2006.01)
H03F 3/24 (2006.01)
H03F 3/195 (2006.01)

(52) U.S. Cl.
CPC ............. *H03F 3/245* (2013.01); *H03F 3/195* (2013.01); *H03F 2200/318* (2013.01); *H03F 2200/451* (2013.01)

(58) Field of Classification Search
CPC ........................................................ H03F 1/22
USPC ................................................... 330/311, 310
See application file for complete search history.

(56) References Cited

U.S. PATENT DOCUMENTS

| | | | |
|---|---|---|---|
| 8,354,889 B2 * | 1/2013 | Karthaus | H03F 1/0233 330/297 |
| 10,819,288 B2 * | 10/2020 | Wagh | H03F 3/189 |

* cited by examiner

*Primary Examiner* — Henry Choe
(74) *Attorney, Agent, or Firm* — Syncoda LLC; Feng Ma

(57) ABSTRACT

A power amplifier circuit includes a power amplification circuit and a diode assembly. The diode assembly is connected in series with a transistor amplification circuit of the power amplification circuit, and the transistor amplification circuit is configured to, when load of power amplifier is mismatched, turn the diode assembly on, so as to divide current voltage to at least two electrodes of the transistor amplification circuit.

14 Claims, 3 Drawing Sheets

POWER AMPLIFIER CIRCUIT

CROSS-REFERENCE TO RELATED APPLICATIONS

This application is a continuation of International Application No. PCT/CN2020/122215 filed on Oct. 20, 2020, which claims priority to Chinese Patent Application No. 202010287500.3 filed on Apr. 13, 2020. The disclosures of these applications are hereby incorporated by reference in their entirety.

BACKGROUND

With the development of technologies and the wide use of radio frequency (RF) applications, power amplifiers in current RF front-end modules are increasingly required to have higher performance and lower cost.

SUMMARY

The present disclosure relates generally to the technical field of electronic circuits, and more specifically to a power amplifier circuit.

Various embodiments of the disclosure provide a power amplifier circuit, including: a power amplification circuit and a diode assembly; the diode assembly is connected in series with a transistor amplification circuit of the power amplification circuit, and the transistor amplification circuit is configured to, when load of power amplifier is mismatched, turn the diode assembly on, so as to divide current voltage to at least two electrodes of the transistor amplification circuit.

According to some embodiments of the present disclosure, the power amplifier is formed by connecting the diode assembly in series with the transistor amplification circuit of the power amplification circuit, such that when the load of the power amplifier is mismatched, drain voltage of the transistor amplification circuit generates a large swing, turning the diode assembly on, and dividing the current voltage of the power amplifier to at least two electrodes of the transistor amplification circuit, allowing the voltage difference between the electrodes of the field effect transistor to be reduced, thereby avoiding the occurrence of breakdown of the field effect transistor of the amplification circuit and improving robustness of the power amplifier.

The power amplifier can be, for example, part of a wireless communication device of a communication system.

DETAILED DESCRIPTION

In order to understand the characteristics and technical contents of the disclosure in more detail, the implementation of the disclosure will be described in detail below with reference to the attached drawings, which are only intended for reference and explanation, and are not intended to limit the disclosure.

Metal-Oxide-Semiconductor Field-Effect Transistor (MOSFET) can have advantages such as lower cost and better integration with digital circuits, etc. However, the high voltage resistance of field effect transistor is not as good as that of traditional Gallium Arsenide (GaAs) crystal, based on the physical structure of the field effect transistor, and Power Amplifier (PA) is a high power device, and when high power and high voltage are output based on using the field effect transistor as the PA, the transistor is easy to be broken down.

Figure 1:
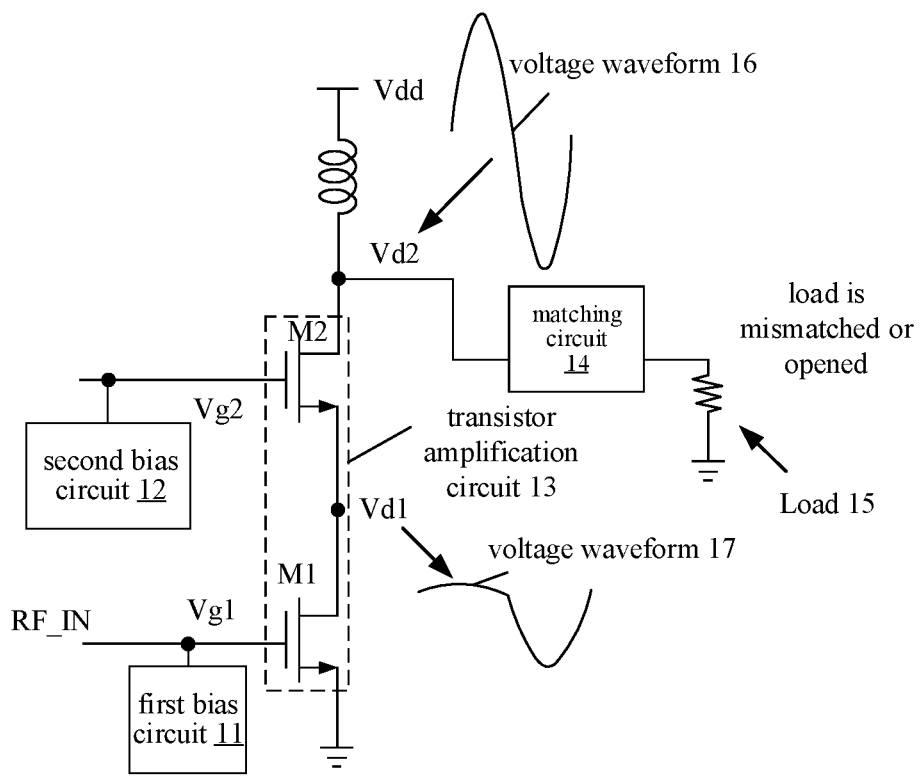
FIG. 1 is a schematic structural diagram of a traditional power amplifier circuit provided by an embodiment of the disclosure.

FIG. 1 is a schematic structural diagram of a power amplifier circuit provided by an embodiment of the disclosure. As shown, the power amplifier circuit includes a first bias circuit 11, a second bias circuit 12, a transistor amplification circuit 13, a matching circuit 14, and a load 15 of power amplifier.

In the above circuit, the bias circuit refers to an additional circuit that allows the circuit to operate normally, and in the power amplifier circuit, the bias circuit plays a very important role, which determines operating state of the power amplifier, and affects distortion and stability of output stage to a large extent. In different power amplifier circuits, the bias circuit may be different, and the specific circuit of the bias circuit is designed by technicians according to needs.

Herein, the transistor amplification circuit 13 includes: a first field effect transistor M1 and a second field effect transistor M2. RF signal input end (RF-in) is connected with one end of the first bias circuit 11, the other end of the first bias circuit 11 is connected with a gate of the first field effect transistor M1; a source of the first field effect transistor M1 is grounded, a drain of the first field effect transistor M1 is connected with a source of the second field effect transistor M2; a gate of the second field effect transistor M2 is connected with one end of the second bias circuit 12; a drain of the second field effect transistor M2 is connected with one end of the matching circuit 14, and the other end of the matching circuit 14 is connected with the load 15 of the power amplifier. When an RF signal is input at the RF-in, voltages will be generated at two field effect transistors, such as the gate voltage Vg1 and the drain voltage Vd1 of the first field effect transistor M1, and the gate voltage Vg2 and the drain voltage Vd2 of the second field effect transistor M2. When the terminal antenna of the power amplifier is opened or mismatched, the circuit will produce a large standing-wave ratio. The alternating voltage Vd2 at the drain of the second field effect transistor M2 of the power amplifier swings greatly (as shown by the voltage waveform 16 in FIG. 1), and reaches a peak value close to four times of the power supply voltage (Vdd), while the gate voltage Vg2 of the second field effect transistor M2 remains the same, and the drain voltage Vd1 of the first field effect transistor M1 almost remains the same (as shown by the voltage waveform 17 in FIG. 1).

In this case, there is a large voltage difference Vgd between the voltage Vgs between the gate and source of the second field effect transistor M2 and the voltage Vds between the drain and source of the second field effect transistor M2, so the second field effect transistor M2 is very easy to be broken down. This greatly limits the range of field effect transistors applying to high power amplifiers. Therefore, the following technical solutions of the embodiments of the disclosure are proposed.

Figure 2:
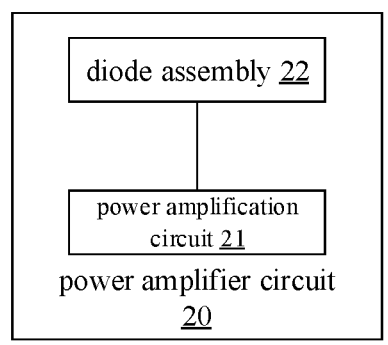
FIG. 2 is a schematic structural diagram of components of a power amplifier circuit provided by an embodiment of the disclosure.

The embodiments of the disclosure provide a power amplifier circuit, FIG. 2 is a schematic structural diagram of components of a power amplifier circuit provided by an embodiment of the disclosure, and as shown in FIG. 2, the power amplifier circuit 20 includes: a power amplification circuit 21 and a diode assembly 22; the diode assembly 22 is connected in series with a transistor amplification circuit of the power amplification circuit 21, and the transistor amplification circuit is configured to, when load of power amplifier is mismatched, turn the diode assembly 22 on, so as to transfer current voltage to at least two electrodes of the transistor amplification circuit.

Here, the load of the power amplifier being mismatched means that when the load of the power amplifier is not equal to a preset ohm value (for example, 50 ohms), a part of the output power of the amplifier is reflected back to the power amplifier, and the reflected power is superimposed with the output power of the amplifier, resulting in a large standing-wave ratio, which may cause the power amplifier to be broken down due to the reflected power.

In some implementable embodiments, the power amplification circuit plays a power amplification role in the power amplifier circuit, and the power amplification circuit 21 includes a first field effect transistor and a second field effect transistor. In a specific example, the diode assembly includes N diodes connected in series. The diode assembly is configured to, when the load of the power amplifier is mismatched, divide the voltage at one end, connected with the matching circuit of the power amplifier, of the power amplification circuit to at least two electrodes of the transistor amplification circuit, allowing the voltage difference in the power amplification circuit to be reduced.

In the embodiments of the disclosure, a new power amplifier is formed by connecting the transistor amplification circuit of the power amplifier in series with the diode assembly, so that when the load of the power amplifier is mismatched, the voltage swing generated at the drain of the power amplification circuit may turn the diode assembly on, and divide the voltage on the drain of the power amplification circuit to at least two electrodes of the transistor amplification circuit, thus reducing the voltage difference of the transistor amplification circuit, avoiding the occurrence of breakdown of the field effect transistor of the transistor amplification circuit and improving the robustness of the power amplifier.

The power amplifier of the embodiments of the disclosure will be exemplified below with reference to the specific circuit structure. It should be noted that the following embodiments are only taken as an example and do not limit the protection scope of the embodiments of the disclosure.

Figure 3:
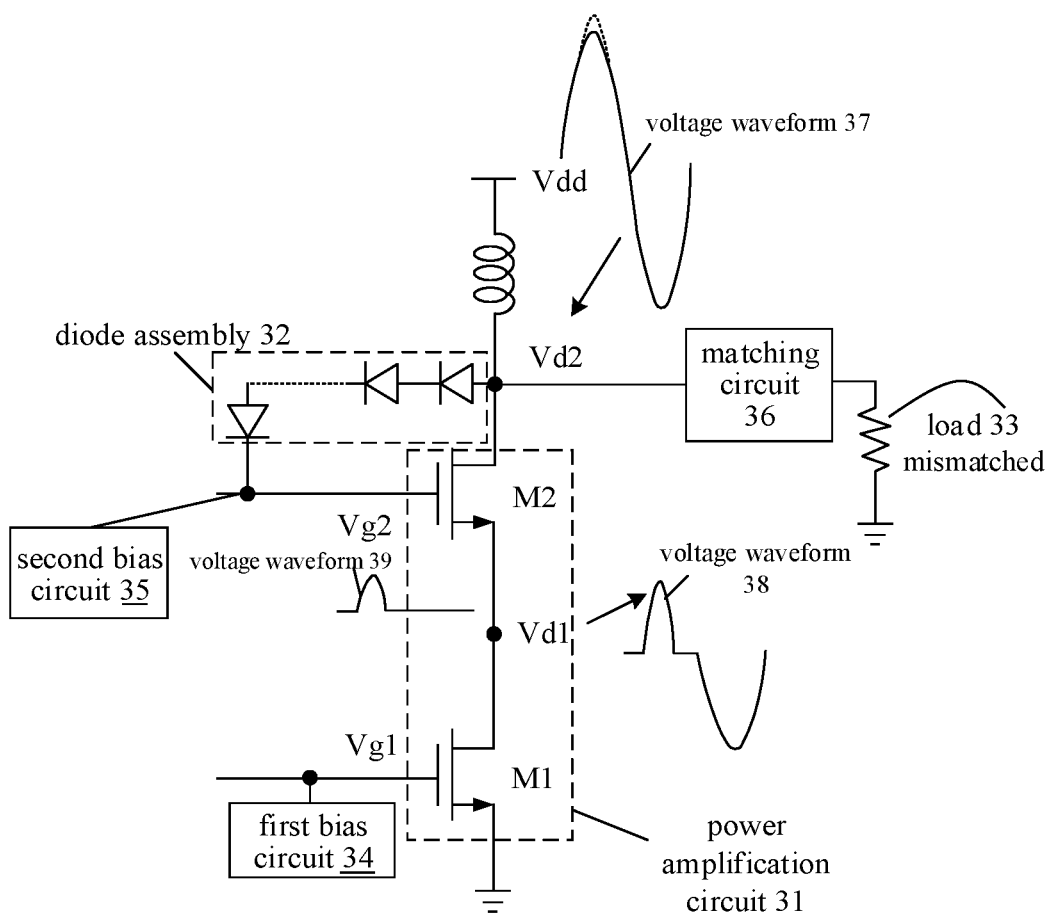
FIG. 3 is a schematic diagram of a power amplifier circuit provided by an embodiment of the disclosure.

FIG. 3 is a schematic diagram of a power amplifier circuit provided by an embodiment of the disclosure, and as shown in FIG. 3, the power amplifier circuit includes: a power amplification circuit 31 and a diode assembly 32; the diode assembly 32 is connected in series with a transistor amplification circuit of the power amplification circuit 31, and the transistor amplification circuit is configured to, when load 33 of power amplifier is mismatched, turn the diode assembly 32 on, so as to divide current voltage to at least two electrodes of the transistor amplification circuit of the power amplification circuit 31.

Here, the power amplification circuit 31 includes field effect transistors. Therefore, in this embodiment, the power amplification circuit 31 is a transistor amplification circuit. The transistor amplification circuit 31 includes a first field effect transistor M1 and a second field effect transistor M2, herein a drain of the first field effect transistor M1 is connected with a source of the second field effect transistor M2. Furthermore, the diode assembly 32 includes: N diodes connected in series, herein N is a positive integer. When the load 33 of the power amplifier is mismatched, that is, when the load 33 is not equal to a preset ohm value (for example, 50 ohms) or when the load of the power amplifier is opened, the drain voltage of the second field effect transistor M2 of the transistor amplification circuit generates a large swing (as shown by the voltage waveform 37 in FIG. 3), which may turn the diode assembly 32 connected in series with the second field effect transistor M2 on, to allow the large voltage swing generated when the power amplifier is mismatched to be transferred to at least two electrodes of the transistor amplification circuit more reasonably, so that the maximum peak value reached by the voltage swing is reduced, avoiding the situation that the voltage swing is completely applied to the drain voltage Vd2 of the second field effect transistor M2, so that Vd2-Vd1 is too large and the breakdown of the field effect transistor occurs.

In some implementable embodiments, a positive electrode of the diode assembly 32 is connected with a drain of the second field effect transistor M2, and a negative electrode of the diode assembly 32 is connected with a gate of the second field effect transistor M2. In this way, when the load of the power amplifier is mismatched, the generated reflected voltage is able to turn the diode assembly on, so that a part of current at the drain of the second field effect transistor M2 of the power amplification circuit flows to the gate thereof, thereby transferring the current voltage to at least two electrodes of the transistor amplification circuit and reducing the voltage difference in the power amplification circuit.

In some implementable embodiments, voltage of the N diodes upon being connected in series is larger than a first voltage difference and is smaller than a second voltage difference; herein the first voltage difference is a difference between a first drain voltage and gate voltage, and the second voltage difference is a difference between a second drain voltage and the gate voltage.

Here, when the load 33 of the power amplifier is not mismatched, the first drain voltage is the peak voltage of the drain voltage Vd2 of the second field effect transistor M2, and the peak voltage is twice of the power supply voltage, that is, Vd2=2*Vdd; and the gate voltage is the gate voltage Vg2 of the second field effect transistor M2; and when the load 33 of the power amplifier is mismatched, the second drain voltage is the peak voltage of the drain voltage Vd2 of the second field effect transistor M2, and the peak voltage is four times of the power supply voltage, that is, Vd2=4*Vdd. The expression of the voltage N*Von of the N diodes upon being connected in series is: 2*Vdd-Vg2<N*Von<4*Vdd-Vg2.

In some implementable embodiments, the power amplifier circuit further includes: a first bias circuit 34, herein the first bias circuit 34 is connected with a gate of the first field effect transistor M1, and the first bias circuit 34 is configured to, when the power amplifier operates, provide a bias voltage for the first field effect transistor M1.

In some implementable embodiments, the power amplifier circuit further includes: a second bias circuit 35, herein the second bias circuit 35 is connected with a gate of the second field effect transistor M2, and the second bias circuit 35 is configured to, when the power amplifier operates, provide a bias voltage for the second field effect transistor M2.

In some implementable embodiments, the power amplifier circuit further includes a matching circuit 36, herein a positive electrode of the matching circuit 36 is connected with a drain of the second field effect transistor M2, and a negative electrode of the matching circuit 36 is connected with the load 33 of the power amplifier, and the matching circuit 36 is configured to convert an impedance of the load 33 of the power amplifier into an impedance matched with an output impedance of the field effect transistor.

In some implementable embodiments, the diode assembly 32 is connected in series with the second field effect transistor M2 of the power amplification circuit 31, and the second field effect transistor M2 is further configured to, when the load 33 of the power amplifier is mismatched, turn the diode assembly 32 on, so that current at a drain of the second field effect transistor of the amplification circuit flows to a gate of the second field effect transistor of the amplification circuit, to raise gate voltage Vg2 of the second field effect transistor M2 and reduce drain voltage Vd2 of the second field effect transistor, and to raise source voltage Vs2 of the second field effect transistor M2, so as to reduce the difference between the source voltage and the drain voltage of the second field effect transistor.

Here, when the load 33 of the power amplifier is mismatched, that is, the impedance of the load 33 is not equal to 50 ohms, the large swing generated by the drain voltage Vd2 of the second field effect transistor M2 of the transistor amplification circuit (as shown by the voltage waveform 37 in FIG. 3) may turn the diode assembly 32 connected in series with the second field effect transistor M2 on, so that a part of current at the drain of the second field effect transistor M2 flows to the source thereof, thereby raising the gate voltage Vg2 (as shown by the voltage waveform 39 in FIG. 3), while increasing the voltage Vgs between the gate and source of the second field effect transistor M2, and reducing the voltage difference Vds between the source and drain of the second field effect transistor M2, which is able to reduce the drain voltage Vd2 of the second field effect transistor M2 and raise the drain voltage Vd1 of the first field effect transistor M1 (as shown by the voltage waveform 38 in FIG. 3). Therefore, the large voltage swing generated when the power amplifier is mismatched, may be transferred to at least two electrodes of the first field effect transistor M1 and the second field effect transistor M2 more reasonably, avoiding the situation that the voltage swing is completely applied to the drain voltage Vd2 of the second field effect transistor M2, so that Vd2-Vd1 is too large and the breakdown of the field effect transistor occurs.

In the embodiments of the disclosure, a new power amplifier is formed by connecting the transistor amplification circuit of the power amplifier in series with the diode assembly, so that when the load of the power amplifier is mismatched, the voltage swing generated at the drain of the power amplification circuit may turn the diode assembly on, and transfer the voltage on the drain of the power amplification circuit to at least two electrodes of the transistor amplification circuit, thus reducing the voltage difference of the transistor amplification circuit, avoiding the occurrence of breakdown of the transistor of the transistor amplification circuit and improving the robustness of the power amplifier.

Figure 4:
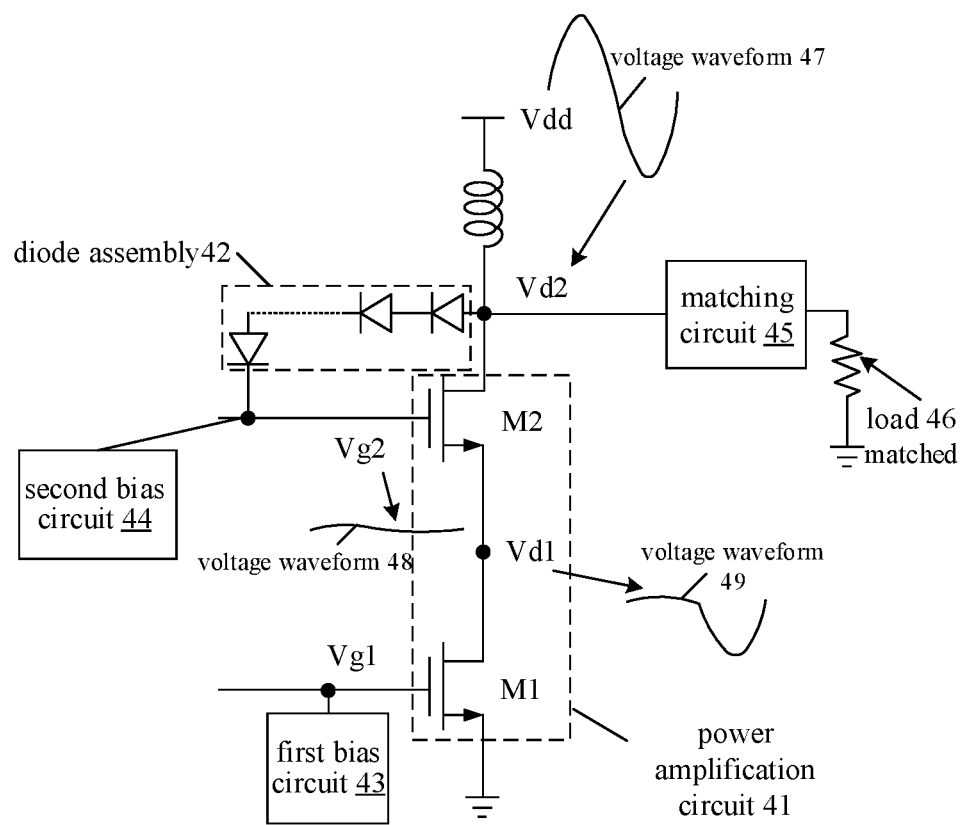
FIG. 4 is another schematic diagram of a power amplifier circuit provided by an embodiment of the disclosure.

The embodiments of the disclosure provide a power amplifier circuit, FIG. 4 is another schematic diagram of a power amplifier circuit provided by an embodiment of the disclosure, and as shown in FIG. 4, the power amplifier circuit includes a power amplification circuit 41, a diode assembly 42, a first bias circuit 43, a second bias circuit 44, a matching circuit 45, and a load 46 of power amplifier. Herein, the power amplification circuit 41 includes a first field effect transistor M1 and a second field effect transistor M2; and the diode assembly 42 includes N diodes connected in series, herein N is a positive integer. The diode assembly 42 is connected in series with the second field effect transistor M2, herein a positive electrode of the diode assembly 42 is connected with a drain of the second field effect transistor M2, and a negative electrode of the diode assembly 42 is connected with a gate of the second field effect transistor M2. In this way, when the load 46 of the power amplifier is matched, that is, when the load of the power amplifier is at a preset ohm value (e.g., 50 ohms), the voltage swing is small (as shown by the voltage waveform 47 in FIG. 4), which cannot reach the turn-on voltage of the diode assembly, so that the diode assembly is in a high impedance state, which hardly affects the load of the power amplifier. Furthermore, the gate voltage Vg2 of the second field effect transistor of a transistor amplification circuit has a small change (as shown by the voltage waveform 48 in FIG. 4), and the drain voltage Vd1 of the first field effect transistor M1 has a small changing amplitude (as shown by the voltage waveform 49 in FIG. 4), allowing the power amplifier to operate normally.

When the load of the power amplifier is mismatched (as shown in FIG. 3) and the drain voltage of the second field effect transistor M2 generates a large swing, N diodes connected in series, i.e., the diode assembly 32, may be turned on, so that a part of current at the drain of the second field effect transistor M2 flows to the source of the second field effect transistor M2, to raise the gate voltage Vg2 of the second field effect transistor M2, and increase the voltage Vgs between the gate and source of the second field effect transistor M2, which is able to reduce the drain voltage Vd2 of the second field effect transistor M2 and raise the drain voltage Vd1 of the first field effect transistor M1. Therefore, the large voltage swing generated when the load of the amplifier is mismatched is able to be distributed to the first field effect transistor M1 and the second field effect transistor M2 of the field effect transistor amplification circuit more reasonably, thus avoiding that the voltage swing is completely applied to the drain voltage Vd2 of the second field effect transistor M2, so that Vd2-Vd1 is too large, and thus the breakdown of the second field effect transistor M2 occurs. This circuit structure successfully avoids the breakdown of the second field effect transistor M2, so the design of amplifier with large output power is able to be realized by using field effect transistors with short channel lengths.

The number N of N series-connected diodes included in the diode assembly of the power amplifier can be determined by the turn-on voltage Von of the diode and the standing-wave ratio generated by the circuit when the power amplifier is mismatched. Generally speaking, the power amplifier needs to meet the following requirements: it is not broken down when the standing-wave ratio of the circuit is 15:1, at this time, the peak voltage of the drain voltage Vd2 of the second field effect transistor M2 is able to reach 4 times of the power supply voltage Vdd, so 2*Vdd-Vg2<N*Von<4*Vdd-Vg2 may be obtained. Then, the number of N diodes included in the diode assembly, that is, the value of N, may be solved according to the actual situation and in combination with the above inequality.

In some implementable embodiments, the gate of the second field effect transistor M2 is further connected with the second bias circuit 44, which is configured to provide a bias voltage for the second field effect transistor M2; and the source of the second field effect transistor M2 is connected with the drain of the first field effect transistor M1. The gate of the first field effect transistor M1 is connected with the first bias circuit 43, which is configured to provide a bias voltage for the first field effect transistor M1; and the source of the first field effect transistor M1 is grounded. The matching circuit 45 of the power amplifier has one end connected with the drain of the second field effect transistor M2 and the other end connected with the load 46 of the power amplifier.

In the embodiments of the disclosure, the diode assembly including N diodes connected in series is connected in series with a second field effect transistor M2 of the power amplification circuit of the power amplifier, so that when the load of the power amplifier is not mismatched, the diode assembly is not turned on, the load of the power amplifier is not affected, allowing the power amplifier to operate normally. When the load of the power amplifier is mismatched, the diode assembly is turned on, so that the drain voltage of the second field effect transistor M2 is able to transferred to at least two electrodes of the field effect transistor of the power amplification circuit, thereby reducing the voltage difference between the electrodes of the field effect transistor, reducing the risk of breakdown of the field effect transistor, improving the robustness of the power amplification circuit when generating a large standing-wave ratio, and enabling the power amplifier with high power output to be realized with field effect transistors. Compared to GaAs process with the same area, it is able to reduce the production cost of RF power amplifier by two thirds.

It should be noted that the types of transistors in the embodiments of the disclosure are not limited to NMOS transistors, but may also be other types of power transistors, such as Heterojunction Bipolar Transistor (HBT) and Bipolar Junction Transistor (BJT) etc.

The technical solutions described in the embodiments of the disclosure may combine in any ways without conflict.

In several embodiments provided in the disclosure, it should be understood that the disclosed method and intelligent device may be implemented in other ways. The device embodiments as described above are only illustrative. For example, the division of units is only a division based on logical functions thereof. In actual implementation, there may be other divisions, for example, multiple units or components may be combined, or may be integrated into another system, or some features may be ignored or may not be executed. In addition, the coupling, or direct coupling, or communication connection between the components shown or discussed may be indirect coupling or communication connection through some interfaces, devices or units, and may be electrical, mechanical or other forms.

The units described above as separated components may be or may not be physically separated, and the components displayed as units may be or may not be physical units, that is, they may be located in one place or distributed to multiple network units; and some or all of the units may be selected according to actual needs to achieve the purpose of the solution of the embodiment.

In addition, all the functional units in each of the embodiments of the disclosure may be integrated into a second processing unit, or each of the units may be taken as a single unit separately, or two or more of the units may be integrated into one unit; and the above integrated units may be implemented in the form of hardware, or in the form of hardware plus software functional units.

The above descriptions are only specific embodiments of the disclosure, but the protection scope of the disclosure is not limited thereto. Any technicians familiar with this technical field may easily conceive of changes or substitutions within the technical scope disclosed in the disclosure, which should be covered within the protection scope of the disclosure.

In the embodiments of the disclosure, there is provided a power amplifier circuit, including: a power amplification circuit and a diode assembly; the diode assembly is connected in series with a transistor amplification circuit of the power amplification circuit, and the transistor amplification circuit is configured to, when load of power amplifier is mismatched, turn the diode assembly on, so as to divide current voltage to at least two electrodes of the transistor amplification circuit.

The terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A power amplifier circuit, comprising:
a power amplification circuit and a diode assembly; wherein
the diode assembly is connected in series with a transistor amplification circuit of the power amplification circuit, and the transistor amplification circuit is configured to, when load of power amplifier is mismatched, turn the diode assembly on, so as to divide a current voltage to at least two electrodes of the transistor amplification circuit;
the transistor amplification circuit comprises: a first field effect transistor and a second field effect transistor, wherein a drain of the first field effect transistor is connected with a source of the second field effect transistor;
the diode assembly comprises: N diodes connected in series, wherein N is a positive integer;
a positive electrode of the diode assembly is connected with a drain of the second field effect transistor, and
a negative electrode of the diode assembly is connected with a gate of the second field effect transistor.

2. A power amplifier circuit, comprising a power amplification circuit and a diode assembly;
wherein
the diode assembly is connected in series with a transistor amplification circuit of the power amplification circuit, and the transistor amplification circuit is configured to, when load of power amplifier is mismatched, turn the diode assembly on, so as to divide a current voltage to at least two electrodes of the transistor amplification circuit;
the transistor amplification circuit comprises: a first field effect transistor and a second field effect transistor, wherein a drain of the first field effect transistor is connected with a source of the second field effect transistor;
the diode assembly comprises: N diodes connected in series, wherein N is a positive integer;
voltage of the N diodes upon being connected in series is larger than a first voltage difference and is smaller than a second voltage difference;
the first voltage difference is a difference between a first drain voltage and gate voltage; and
the second voltage difference is a difference between a second drain voltage and the gate voltage.

3. The power amplifier circuit of claim 1, wherein
the power amplifier further comprises a first bias circuit;
the first bias circuit is connected with a gate of the first field effect transistor; and
the first bias circuit is configured to, when the power amplifier operates, provide a bias voltage for the first field effect transistor.

4. The power amplifier circuit of claim 3, wherein
the power amplifier further comprises a second bias circuit;
the second bias circuit is connected with a gate of the second field effect transistor; and
the second bias circuit is configured to, when the power amplifier operates, provide a bias voltage for the second field effect transistor.

5. The power amplifier circuit of claim 1, wherein
the power amplifier further comprises a matching circuit;
a positive electrode of the matching circuit is connected with a drain of the second field effect transistor, and a negative electrode of the matching circuit is connected with the load of the power amplifier; and
the matching circuit is configured to convert an impedance of the load of the power amplifier into an impedance matched with an impedance of an output end of the second field effect transistor.

6. The power amplifier circuit of claim 1, wherein
the diode assembly is connected in series with the second field effect transistor of the power amplification circuit; and
the second field effect transistor is further configured to, when the load of the power amplifier is mismatched, turn the diode assembly on, such that current at a drain of the second field effect transistor of the amplification circuit flows to a gate of the second field effect transistor of the amplification circuit, to raise gate voltage of the second field effect transistor and reduce drain voltage of the second field effect transistor, and to raise source voltage of the second field effect transistor, so as to reduce the difference between the source voltage and the drain voltage of the second field effect transistor.

7. A communication system comprising a power amplifier circuit including a power amplification circuit and a diode assembly;
wherein
the diode assembly is connected in series with a transistor amplification circuit of the power amplification circuit, and the transistor amplification circuit is configured to, when load of power amplifier is mismatched, turn the diode assembly on, so as to divide a current voltage to at least two electrodes of the transistor amplification circuit; and
the transistor amplification circuit is configured to generate a swing in a drain voltage when the load of the power amplifier is mismatched, thereby allowing a voltage difference between the electrodes of a field effect transistor of the transistor amplification circuit to be reduced, and avoiding occurrence of breakdown of the field effect transistor of the amplification circuit and improving robustness of the power amplifier.

8. The communication system of claim 7, wherein
the transistor amplification circuit comprises: a first field effect transistor and a second field effect transistor, wherein a drain of the first field effect transistor is connected with a source of the second field effect transistor; and
the diode assembly comprises: N diodes connected in series, wherein N is a positive integer.

9. The communication system of claim 8, wherein
a positive electrode of the diode assembly is connected with a drain of the second field effect transistor, and a negative electrode of the diode assembly is connected with a gate of the second field effect transistor.

10. The communication system of claim 8, wherein
voltage of the N diodes upon being connected in series is larger than a first voltage difference and is smaller than a second voltage difference;
the first voltage difference is a difference between a first drain voltage and gate voltage; and
the second voltage difference is a difference between a second drain voltage and the gate voltage.

11. The communication system of claim 10, wherein
the power amplifier further comprises a first bias circuit;
the first bias circuit is connected with a gate of the first field effect transistor; and
the first bias circuit is configured to, when the power amplifier operates, provide a bias voltage for the first field effect transistor.

12. The communication system of claim 11, wherein
the power amplifier further comprises a second bias circuit;
the second bias circuit is connected with a gate of the second field effect transistor; and
the second bias circuit is configured to, when the power amplifier operates, provide a bias voltage for the second field effect transistor.

13. The communication system of claim 8, wherein
the power amplifier further comprises a matching circuit;
a positive electrode of the matching circuit is connected with a drain of the second field effect transistor, and a negative electrode of the matching circuit is connected with the load of the power amplifier; and
the matching circuit is configured to convert an impedance of the load of the power amplifier into an impedance matched with an impedance of an output end of the second field effect transistor.

14. The communication system of claim 8, wherein
the diode assembly is connected in series with the second field effect transistor of the power amplification circuit; and
the second field effect transistor is further configured to, when the load of the power amplifier is mismatched, turn the diode assembly on, such that current at a drain of the second field effect transistor of the amplification circuit flows to a gate of the second field effect transistor of the amplification circuit, to raise gate voltage of the second field effect transistor and reduce drain voltage of the second field effect transistor, and to raise source voltage of the second field effect transistor, so as to reduce the difference between the source voltage and the drain voltage of the second field effect transistor.

\* \* \* \* \*